United States Patent [19]

Chu et al.

[11] 4,050,507

[45] Sept. 27, 1977

[54] METHOD FOR CUSTOMIZING NUCLEATE BOILING HEAT TRANSFER FROM ELECTRONIC UNITS IMMERSED IN DIELECTRIC COOLANT

[75] Inventors: Richard C. Chu, Poughkeepsie; Kevin P. Moran, Wappingers Falls, both of N.Y.

[73] Assignee: International Business Machines Corporation, Armonk, N.Y.

[21] Appl. No.: 591,198

[22] Filed: June 27, 1975

[51] Int. Cl.² .......................... F28D 5/00; F28F 13/18
[52] U.S. Cl. .......................................... 165/1; 62/527; 165/96; 165/133; 165/DIG. 3; 219/121 EB; 219/121 LM; 357/82
[58] Field of Search ...................... 165/133, 1, DIG. 3, 165/96; 62/527, 528; 219/121 EB, 121 LM; 357/82

[56] References Cited

U.S. PATENT DOCUMENTS

| | | | |
|---|---|---|---|
| 3,207,209 | 8/1965 | Hummel | 165/133 |
| 3,301,314 | 1/1967 | Gaertner | 165/133 |
| 3,410,979 | 11/1968 | Larsson | 219/121 LM |
| 3,684,007 | 8/1972 | Ragi | 62/527 |
| 3,741,292 | 6/1973 | Aakalu et al. | 165/105 |

OTHER PUBLICATIONS

Haun, Jr., *Laser Applications,* IEEE Spectrum, May 1968.
Chu et al., IBM Technical Dislosure Bulletin, vol. 11, No. 3, Aug. 1968.

*Primary Examiner*—Carroll B. Dority, Jr.
*Assistant Examiner*—Sheldon Richter
*Attorney, Agent, or Firm*—Harold H. Sweeney, Jr.

[57] ABSTRACT

A method is provided for customizing the heat transfer from the walls of an electronic unit such as a semi-conductor chip or wafer by determining the required heat transfer characteristics of the units; drilling holes of a predetermined size and location in the walls of the unit with a high energy beam in accordance with the required heat transfer characteristics of the unit; immersing the unit in a suitable dielectric coolant so that nucleate boiling will start at approximately the desired wall temperature to obtain the required heat transfer from the unit, thereby providing a uniform wall temperature.

A further aspect of the invention is the inclusion of a heater means located at or near the bottom of the heat transfer wall so that bubble generation can be started thereat, which bubbles wash the liquid from the downstream drilled holes or natural nucleation sites, thereby starting nucleate boiling when the required temperature is reached.

10 Claims, 13 Drawing Figures

TYPICAL BOILING CURVE

HYSTERESIS IN BOILING

LASER NUCLEATION CAVITY $2 < \dfrac{L}{D_A} < 4$ $3u < D_A < 15u$

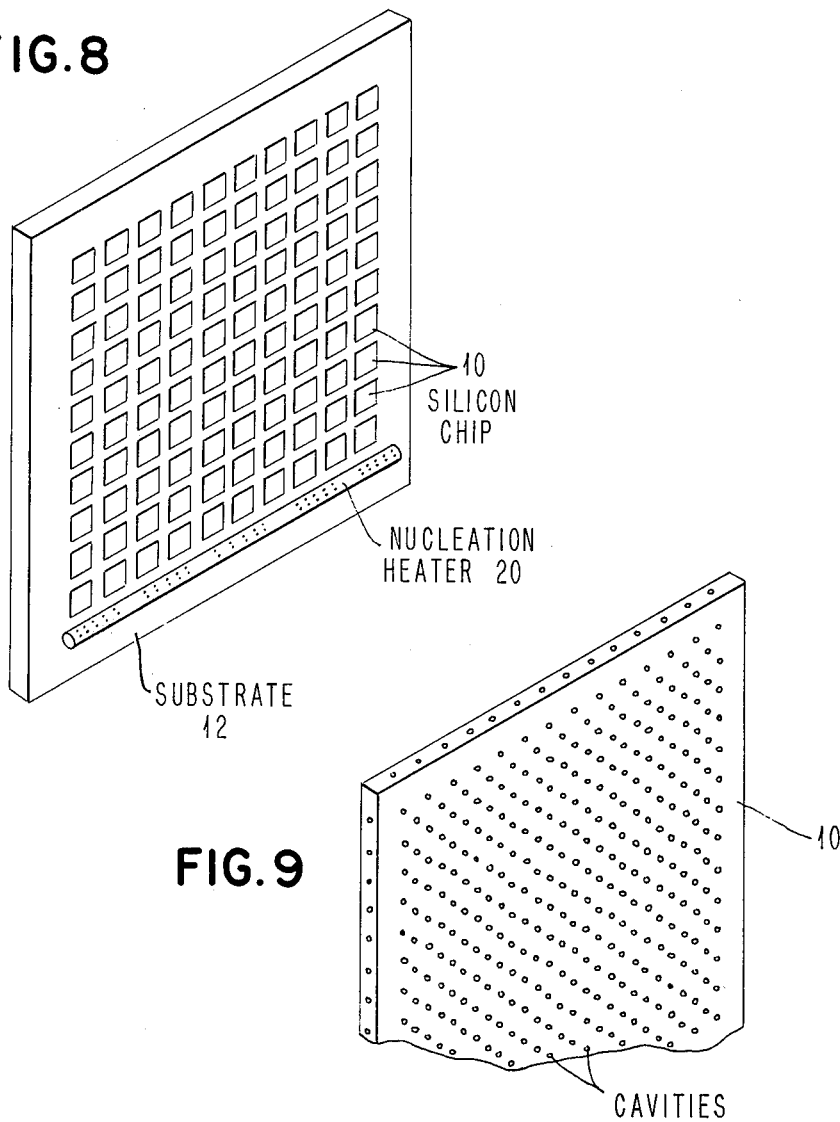
FIG. 8
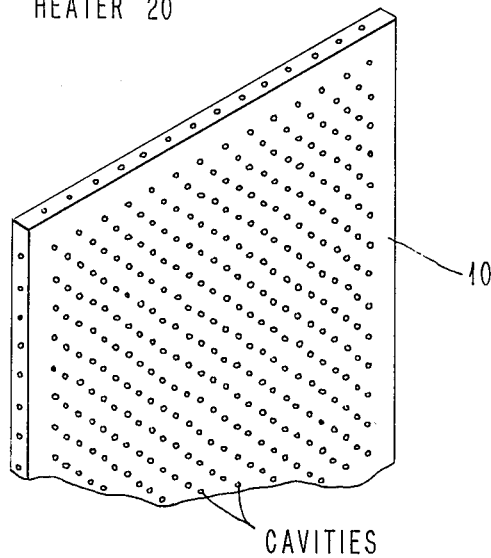
FIG. 9
FIG. 10
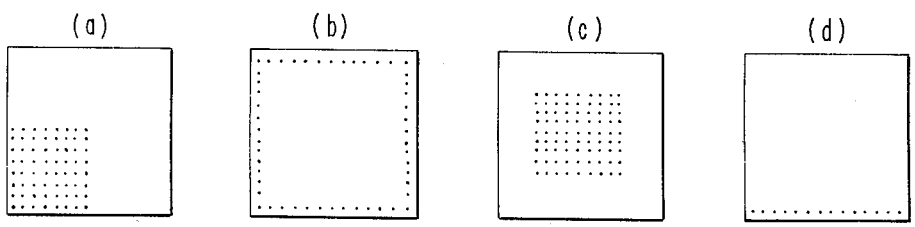

METHOD FOR CUSTOMIZING NUCLEATE BOILING HEAT TRANSFER FROM ELECTRONIC UNITS IMMERSED IN DIELECTRIC COOLANT

STATEMENT OF THE INVENTION

The invention relates to a method for customizing the heat transfer from the walls of an electronic unit such as a semi-conductor chip or wafer and, more particularly, to the high energy beam drilling and location of bubble nucleation sites, and means for starting the nucleate boiling of these sites at a predetermined temperature to maintain the same temperature over the entire unit being cooled.

BACKGROUND OF THE INVENTION

With the advent of large scale integration of electronic components, there has been an ever increasing demand for improved cooling. The improvement required is not only in the form of higher capability, but requires a more uniform temperature across the entire surface being cooled as well as control of the temperature variations thereof. For most of the lower performance applications, air convection cooling has proved to be adequate. However, the high performance applications, that is, where the power density (or flux) is sufficiently high liquid cooling is required. Various liquid immersion cooling schemes have been devised to handle such requirements, but none have proven capable of achieving temperature control by way of cooling customization. This invention sets forth a method of enhancing and controlling the nucleate boiling of the electronic units such as seim-conductor devices in a dielectric coolant. The theory of nucleate boiling as a means to provide cooling is well known in the literature. For example, U.S. Pat. No. 3,301,314 sets forth a method and means for increasing the heat transfer co-efficient between a wall and a boiling liquid. This enhancement was obtained by depositing a low surface energy material, such as polytetrafluoroethyline, within the artificial nucleation sites. This treatment not only causes the artificial nucleation sites to remain active during prolonged steady-state boiling, but also causes the sites to remain unquenched for a remarkably long period of time, when the system is subjected to temperature cycling. The application of coatings of any kind are not particularly applicable to semi-conductor operations and cause, in some situations, adverse affects, such as material incompatibility, etc. The nucleation sites havve been formed in the surfaces to be cooled by punches, which make small conical indentations or, as is set forth in U.S. Pat. 3,454,081, grooves are made on the surfaces to be cooled by an appropriate tool, and the ridges left thereby are bent over to form cavities within the grooves between the ridges. These proposed machining techniques of scratching and bending the tips of ridges are highly undesirable and incompatible with the manufacture of semi-conductor devices.

The conventional nucleate boiling techniques present two basic problems for semi-conductor application; exhibits is the so called hysteresis which is very much amplified due to the highly polished surfaces of semi-conductors, the other is related to the departure point from nucleate boiling, commonly referred to as DNB (Departure from Nucleate Boiling). The hysteresis problem can be described as the lag in the starting of nucleate boiling and the continuation of the natural convection cooling. This lag causes an undesirable increase in temperature of the unit being cooled. The hysteresis problem is also related to the properties of the dielectric coolant, such as fluorocarbon, which has a very low surface tension and exhibbits an enormous wettability of solid surfaces. In fact, this coolant sometimes wets all natural surface cavities and therefore, causes what is called "cavity deactivation," making it impossible for nucleate boiling to start except at high levels of surface superheat. Another problem associated with hysteresis is the fact that it is virtually unpredictable. Naturally, the unpredictability and the magnitude of the overshoot is not tolerable for cooling applications. With regard to the departure point from nucleate boiling, DNB, it is a manageable problem except that there is a continuing demand to improve that point so that higher heat fluxes can be handled without the possibility of getting into the film boiling regime. Actually, many techniques for application in water have been found to be either ineffective for fluorocarbon liquid because of it's low surface tension or not applicable to the surface of semi-conductors, or a combination of both. The foregoing disadvantages have been overcome by drilling holes in the surfaces to be cooled by a high energy beam such as a laser or electronic beam (E Beam). These high energy beams create specially shaped and finished cavities in the surfaces to be cooled, which cavities have much higher probability of surviving total wetting, and thus serve as more reliable nucleation sites. Also, bubbles or vapors generated from these artificial sites will also enter some of the downstream natural or artificial nucleation sites which have been wetted, and cause what is commonly referred to as cavity reactivation. The cross-section and entrance shapes of the high energy beam created cavities is not only easily done on semi-conductor surfaces, but is also unique in the sense that there is no other known technique that can exactly duplicate it. Of course, the high energy beam method of generating nucleation sites can be controlled to produce cavities of different size, depth and pattern so that cooling customization, that is treating the entire chip or a section or corner of a chip as required, can be attained.

SUMMARY OF THE INVENTION

Accordingly, it is the main object of the present invention to provide a method for customizing the heat transfer from the walls of an electronic unit such as a semi-conductor chip or wafer.

It is another object of the present invention to provide a method for reliably starting nucleate boiling at a predetermined temperature so that temperature overshoot or hysteresis is prevented.

It is a further object of the present invention to provide a method of generating specially shaped cavities on semi-conductor or other heat dissipating surfaces, which substantially eliminate hysteresis in boiling, and further extend the point of departure from nucleate boiling.

It is another object of the present invention to provide a method for improving heat transfer which is readily adaptable to a semi-conductor assembly without causing any adverse effects such as results from machining, coating, etc.

It is another object of the present invention to provide a heater means, in conjunction with the high energy beam produced cavities, to start nucleate boiling at a predetermined temperature.

Briefly, the invention consists of a method for customizing the heat transfer from the walls of an electronic unit such as a semi-conductor chip or wafer, wherein the required heat transfer characterisitcs of the unit are determined, and holes of a predetermined size and location are drilled in the walls of the unit with a high energy beam in accordance with the required heat transfer characteristic of the unit. The unit is then immersed in a suitable dielectric coolant so that nucleate boiling will start at approximately the desired wall temperature to obtain the required heat transfer from the unit.

The invention also includes a heater means, located at or near the bottom of the heat transfer wall, to start bubble generation when the required temperature is reached.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 8 is a perspective diagram showing a multi-chip module having a nucleation heater in place thereon.

FIG. 9 is a blown up view of one of the chips of the multi-chip module shown in FIG. 8 with artificial cavities formed on the surface walls thereof.

FIG. 10 is a schematic representation of a number of chips having artificial cavities customized with respect thereto.

DESCRIPTION OF THE PREFERRED EMBODIMENT

Nucleate boiling is a phenomenon that takes place as the energy input in the form of heat from a solid surface to a surrounding liquid is increased, a point will be reached where vapor bubbles will form on the surface to be cooled. These bubbles form in preferred sites or nuclei. Initially, if the liquid temperature is below the saturation temperature of the liquid, the vapor bubbles will collapse. However, as the liquid temperature and energy input are increased, the bubbles will become more numerous. This process is referred to as nucleate boiling. The condition in which the liquid temperature is below the liquid saturation temperature is called subcooled boiling. As the bulk temperature approaches the saturation temperature, the process is called saturated boiling.

Figure 1:
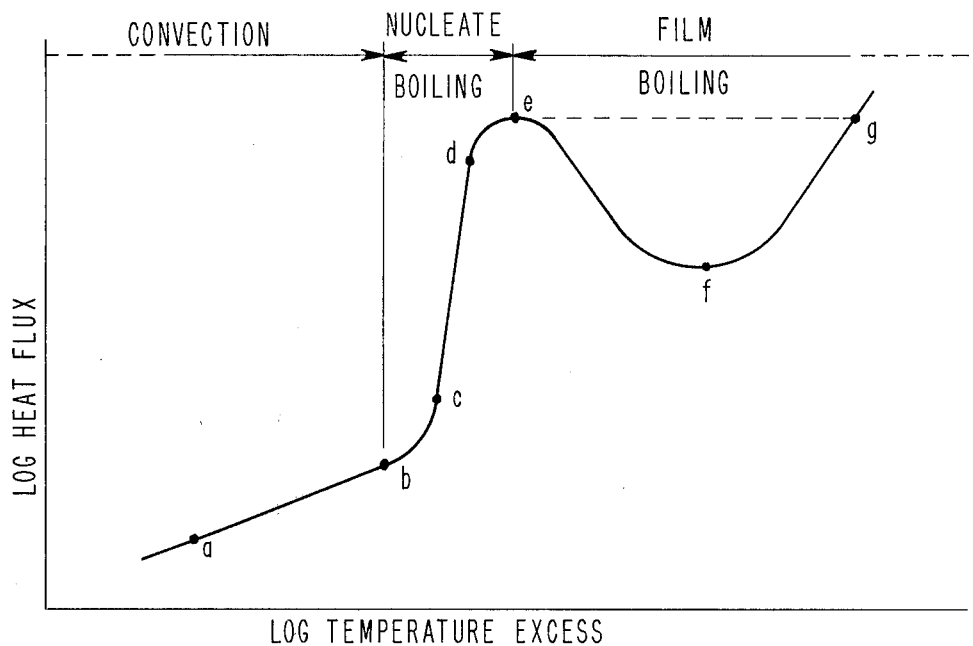
FIG. 1 is a graph showing a typical boiling curve.

The boiling process is best illustrated by means of a boiling curve, FIG. 1, which is a log-log plot of heat flux versus the temperature difference between the heated surface and the saturation temperature of the liquid. For low values of heat flux the plot will be a straight line with a slope of approximately 5/4, and the mode of heat transfer will be natural convection. The knee of the curve, b-c, represents the region where bubbles begin to form on the heated surface. From c to d the plot is again linear, but with a much steeper slope indicating a significant increase in heat transfer rate. At a heat flux designated at point d, the heater surface becomes crowded with vapor bubbles, and there is a decrease in the heat transfer rate. This point is known as the departure from nucleate boiling (DNB). If the heat flux is raised further to point e, the burnout point of heat flux will be reached. An insulating film will form on the heated surface at this point. The region is an unstable one, and under certain conditions the temperature difference will change rapidly to point g. The surface temperature will be extremely high so that many materials will char or melt. For any practical cooling system to be used with electronic equipment, the operating point should be at or below point d.

Figure 2:
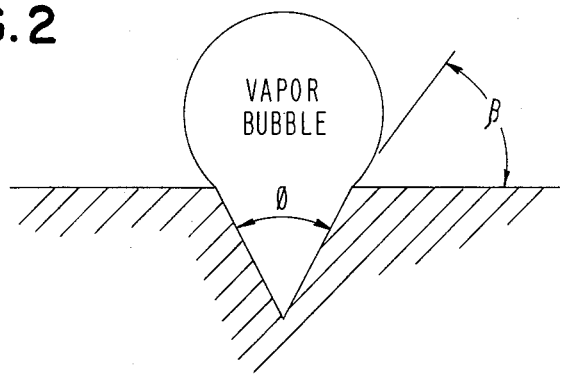
FIG. 2 is a schematic representation of a vapor bubble formed from an artificial cavity.

There is general agreement in the heat transfer literature that nucleation is initiated by absorbed gas in the heated surface cavities, and that the liquid in the immediate vicinity of the heated surface must be superheated. A simplified model, represented by a conical cavity in the surface with a spherically shaped bubble emerging from it, is customarily used, as shown in FIG. 2. The contact angle B is described as the angle measured from the solid surface through the liquid to a tangent from the bubble. The contact angle results from surface tension, and is a measure of how well the liquid wets the solid surface. The angle $\phi$ is the angle formed by the sides of the cavity and is an approximate indication of the roughness of the solid surface. Surface conditions have a pronounced affect on the shape of the boiling curve.

Figure 3:
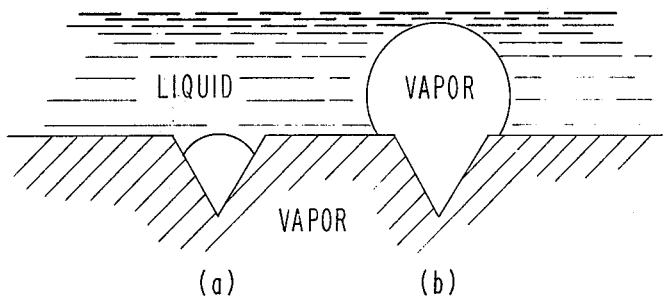
FIG. 3 is a schematic representation of the growth of a vapor bubble from nucleation sites.
Figure 4:
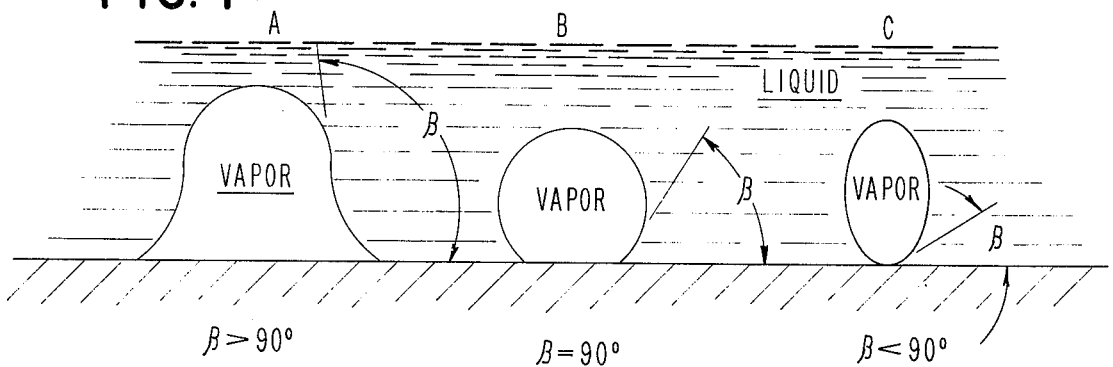
FIG. 4 is a further schematic representation showing characteristic bubble shapes with varying values of surface tension.
Figure 5:
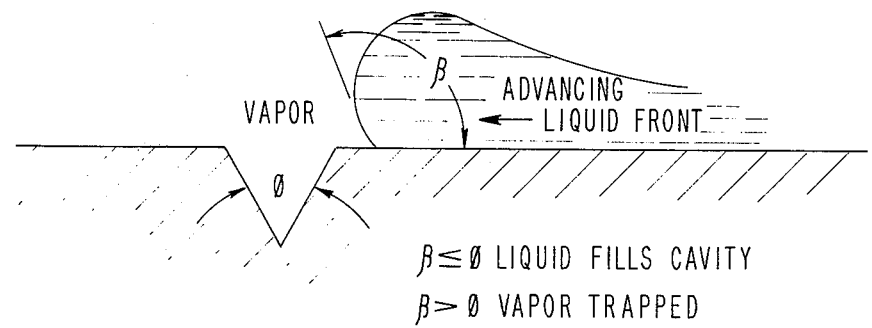
FIG. 5 shows an advancing liquid front approaching a nucleation site with the various dimensions used in the theoretical explanation.
Figure 6:
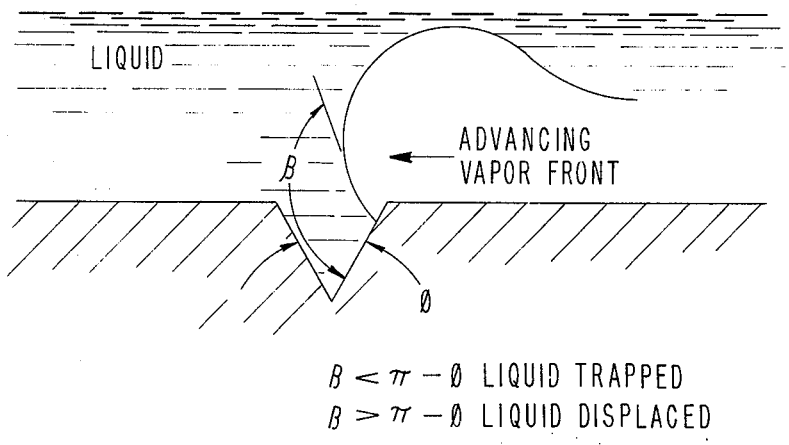
FIG. 6 is a schematic representation of an advancing vapor front with respect to a nucleation site.

An expression has been developed for predicting the degree of superheat required to initiate the growth of a vapor bubble. This equation uses an equillibrium balance of hydrostatic and surface tension forces acting on a spherical bubble in combination with the Clausius-Clapeyron relationship between saturation temperature, pressure, enthalpy and specific volume. When heat is added, the vapor bubble begins to grow in the cavity. The growth is caused by evaporation at the liquid-vapor interface in the vicinity of the heated wall. Initial bubble growth is dependent upon the wall superheat and surface tension. Once the bubble grows above the cavity surface (see FIG. 3), surface tension relationships on the surface and the bulk temperature of the liquid become important. If the liquid is superheated, the bubble will grow until the buoyant force exceeds the surface tension force and the bubble will detach and rise through the liquid. If the liquid is highly subcooled, the bubble may collapse on the surface. The effects of surface tension on the bubble shapes are shown in FIG. 4. As the bubbles grow and detach, a quantity of vapor is generally trapped in the cavity serving as a nucleus for the formation of a succeeding bubble. If great care is taken to eliminate favorable nucleation centers, extremely high values of superheat can be reached before nucleate boiling occurs. The conditions under which vapor may be removed from nucleation sites by an advancing liquid is shown in FIG. 5. After departure or collapse of a bubble, the liquid advances towards the cavity. The liquid will fill the cavity and no vapor will remain if $B \leqq \phi$. If, however, $B \leqq \phi$, some vapor will be entrapped below the liquid and remain within the cavity. This condition favors further nucleation. A liquid filled cavity can likewise be activated by an advancing vapor front, as shown in FIG. 6, if $B > \pi - \phi$.

High rates of heat transfer are achievable in nucleate boiling. These rates are a result of a combination of latent heat transfer and the turbulence produced by the growth, collapse or detachment of vapor bubbles. A bubble forms on the heated surface and grows into the liquid. The bubble will collapse or detach depending on the level of liquid sub-cooling. In any event, the bubble is removed from the surface and the resulting void is filled with high velocity, lower temperature, liquid. This violent liquid action in the vicinity of the heated surface is responsible for the higher rate of heat transfer associated with nucleate boiling.

Figure 7:
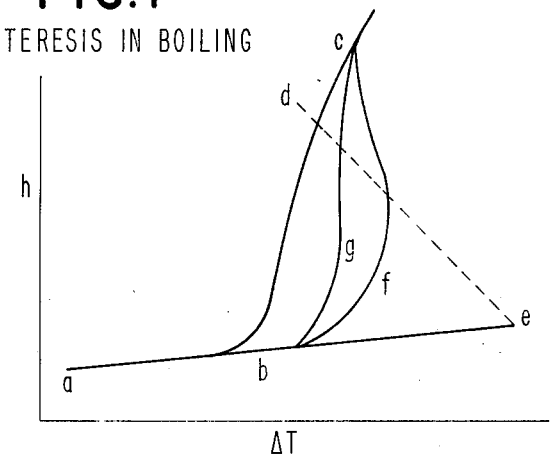
FIG. 7 is a graphical representation of hysteresis in nucleate boiling.

Thermal hysteresis is a phenomenon that is characterized by a deviation from the boiling curve, that is, the temperature of the surface upon which the nucleate boiling is to take place goes beyond the temperature at which nucleate boiling should start. The vapor trapping phenomenon previously discussed has been advanced as a partial cause for the hysteresis effect. FIG. 7 illustrates the action of thermal hysteresis with respect to the boiling curve. A surface boiling at point $c$ for some time eventually becomes gas-free. Reduction in heat flux causes the boiling condition to follow path $cdba$, where eventually boiling is completely eliminated. A subsequent increase in heat flux may cause the path to go out to point $e$ before boiling begins somewhat violently and causes a return to point $c$. Curves $g$ and $f$ represent alternate paths for differing amounts of initially active bubble patches. The extent of surface superheat attainable before nucleate boiling begins depends on the surface roughness; smoother surfaces show less superheat than the rougher surfaces. This suggests that smaller cavities are more effective in retaining vapor, while larger cavities tend to be penetrated by liquid and so are not likely to trap vapor.

The foregoing theory of nucleate boiling is applied, in the present invention, to semi-conductor devices by drilling artificial nucleation site holes having a special shape by high energy beams such as lasers or electron beams, so that the hysteresis effect is minimized and the boiling curve is extended somewhat. These high energy beam drilled holes are applied to silicon chips 10, which are mounted on substrates 12, as shown in FIG. 8. The chips can be the well known silicon chips and, as shown, are mounted face down into the substrate 12. FIG. 9 shows a blown up view of one of the chips 10, wherein the high energy beam holes have been drilled throughout the back surface of the chip and along the four adjacent sides thereof, only two adjacent sides of which are shown. The desired cooling requirement is to maintain each of the chips 10 at a predetermined temperature. It should be appreciated that many of the chips 10 may require a higher power than others and, accordingly, a greater heat flux will be generated. The drilled holes having a special shape giving rise to controlled nucleate boiling are placed thereon so that the chip will have a higher cooling effect, and consequently maintain the desired temperature by removingg the heat more effectively than from a chip having no artificial sites thereon. Also the chips 10 can have the artifical nucleation sites drilled in a certain location on the back of the chip, as shown in FIG. 10, so that a hot spot or section can have a higher heat transfer or cooling rate than the rest of the chip, to thereby maintain a constant temperature gradient over the entire chip.

It is necessary to determine the heat characteristics of the chip so that the number and location of the high energy beam drilled holes can be decided. For example, (a) in FIG. 10 was found to have a hot spot or section in the lower left hand corner. Accordingly, that lower left hand section has high energy beam drilled holes added to increase flux in that area. This arrangement of determining the heat characteristics of the chip and appropriately drilling the high energy beam holes provides a chip having an even temperature thereover. Similarly, chip (c) in FIG. 4 is customized by including the high energy beam holes in the middle of the chip where the high heat flux was required. Chips (b) and (d) have the high energy beam nucleate boiling holes located along the outer edges thereof. In chip (b) the line of holes will always be along the bottom edge of the chip no matter which edge is at the bottom. Chip (d) requires that the chip be oriented vertically when submerged in a cooling liquid with the row of holes at the bottom. These edge drilled holes perform a very important function in the nucleate boiling phase of heat removal, in that they tend to start the nucleate boiling at a lower temperature than the natural nucleation sites on the surface. The nucleate boiling starts at a lower temperature because of the improved nucleation holes obtained by drilling with a laser or electron beam. If the chip, such as chip (d) in FIG. 10 is oriented such that the surface is substantially vertical in the cooling fluid and the row of holes is at the bottom, the vapor bubbles generated by the improved artificial nucleation sites rise and provide vapor or what is called reactivation of the natural nucleation sites to start nucleate boiling at those sites.

Figure 11:
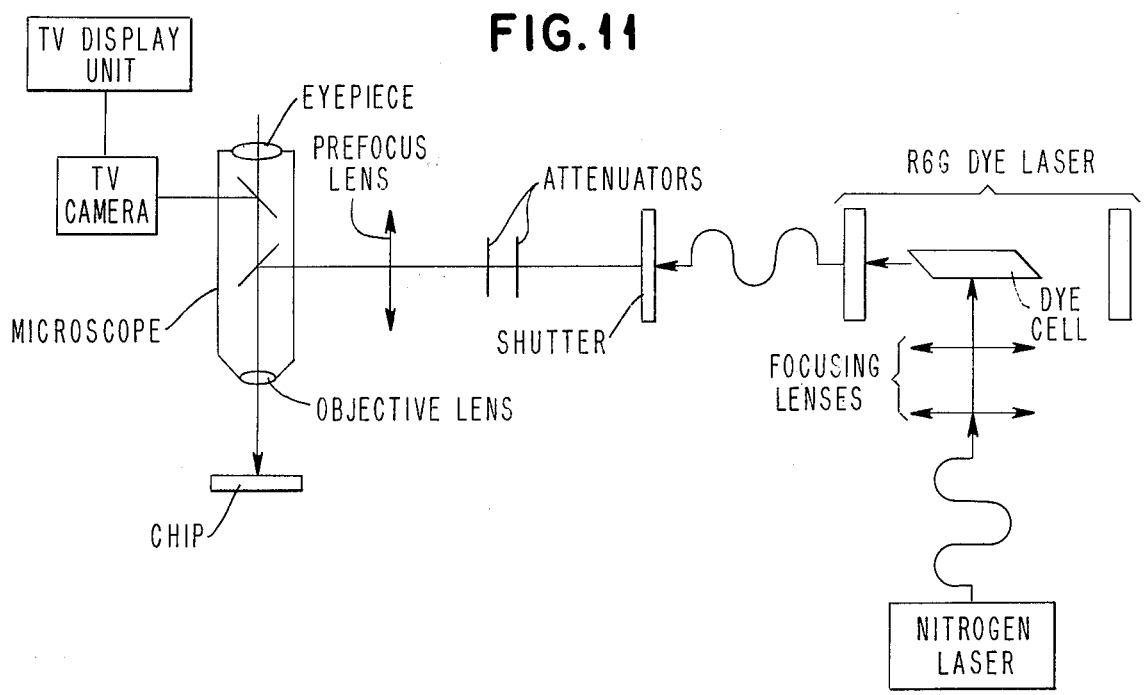
FIG. 11 is a schematic illustration of a laser drilling apparatus.

The specially shaped artificial cavities are created by using a high energy beam such as a laser beam or E beam equivalent. Actually, cavities of various diameters and depths can be achieved by a combination of focus adjustments and pulsation rates generated in the high energy beam generator. The laser system, which was employed to drill the required holes, is shown schematically in FIG. 11. The laser system consists of a nitrogen gas laser, a dye-laser and a modified microscope with a t.v. viewing camera and a display unit. The nitrogen laser excites the dye-laser, the microscope focuses the dye-laser radiation onto the chip, and the television system provides means for visual observation. Two cylindrical focusing lenses are utilized between the nitrogen laser and the dye cell. The output power, pulse width and spot quality of the dye-laser can be controlled by adjusting the mirrors of it's cavity, by altering the above mentioned focusing lenses which focus the nitrogen laser radiation onto the dye cell, or by changing the high voltage to the nitrogen laser. A mechanical shutter and a pre-focusing lens are located between the dye-laser and the microscope. This arrangement is used for applying a pre-set number of pulses and for adjusting to insure that the focal planes of the nitrogen and dye-laser radiations coincide. The electronics for controlling the pulse repetition rate, the peak power of the nitrogen laser and the number of pulses are not shown.

Figure 12:
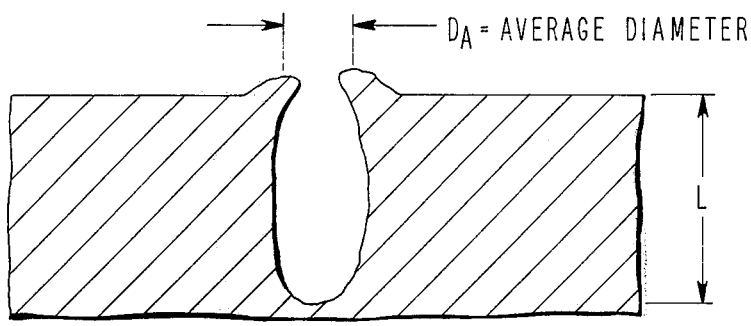
FIG. 12 is a blown up schematic diagram of a typical laser nucleation cavity formed in the chips of FIG. 9.

The shape and cross-sectional area of a laser drilled cavity is shown in the attached FIG. 12. The profile shown is unique and is quite difference from that obtained by conventional drilling or machining operations. The particular shape is made possible because of the succession of multiple, repetitive high energy pulses. Each pulse enlarges the cavity diameter until a certain critical diameter and depth is reached. Further pulsation results in decreasing the cavity diameter until the desired cavity depth is achieved. This concave shape is possible only if the laser beam intensity is held constant. Thus, at constant beam intensity the effects of laser etching increase gradually to a maximum after which these effects decrease until either the desired or maximum obtainable depth is obtained. In FIG. 12, the depth or length of the artificial cavity formed by the laser beam is designated as L. The average diameter is shown as $D_A$. It has been found by experimentation, that the unique laser drilled hole must have a length to diameter ratio $2 < L/D_A < 4$ to be effective. Also, the diameter should be in the range of $3\mu < D_A < 15\mu$. It has been found that a hole within these dimensional ranges is effective in dielectric liquid, such that complete wetting therein does not take place, and vapors are trapped so that site deactivation is minimized. Accordingly, nucleate boiling starts at these shaped sites at approximately the same temperature each time, and they are effective in extending the nucleate boiling beyond the usual departure point (DNB). It will be appreciated that not only the hole dimensions are easily controlled, but the particular position of the hole can be programmed into the aiming of the beam device. Accordingly, the beam device can be stepped to particular positions so that a uniform hole location can be obtained for identical chips. Evidently, the high energy beam enters the surface and releases it's energy below the surface to essentially burnout a clean opening thereunder. It can be seen that the opening of the hole tends to have a narrow entrance with a slightly built up section on either side. Applying the foregoing theory explained in connection with a conical opening to the high energy beam drilled hole as shown in FIG. 12, it can be surmised that the liquid will tend to cross over the narrow opening, and thus not wet the entire inner hole surfaces to any great degree, thereby trapping some vapor in the hole to produce the nucleate boiling.

Figure 13:
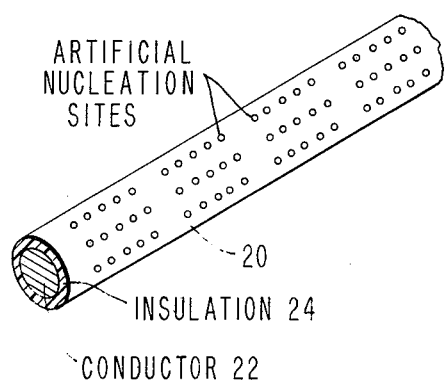
FIG. 13 is a perspective view of a customized segment of the nucleation heater shown in FIG. 8.

As has been mentioned in the foregoing theoretical discussion of nucleate boiling, temperature cycling of the nucleate boiling sites tends to exhaust the vapor in the site and cause temperature overshoot or hysteresis in the surface being cooled. Accordingly, to overcome this problem a nucleation heater 20 has been introduced along the bottom edge of the surface to be cooled or preferably along the bottom edge of the substrate containing the chips to be cooled as shown in FIG. 8. The individual heater element 20 on each chip or on the substrate just below the bottom row of chips performs the identical function in both situations, that is, the heater can be heated so that nucleate boiling takes place thereat causing the nucleate bubbles to break away from the heater and to rise along the surfaces of the chips. These rising vapor bubbles, as mentioned previously, tend to wash the liquid from the artificial or natural nucleation sites, thus, starting nucleate boiling at a lower temperture than would normally be the case without the heater. It should be appreciated, that the providing of the vapor in the various nucleate boiling sites enables the boiling to start at approximately the desired temperature, thereby eliminating the hysteresis overshoot previously mentioned. The heater 20 is shown in detail in FIG. 13. The heater element 20 can be a resistance wire 22 containing the insulation 24 or no insulation for that matter. The heater element can be customized the same way as the chip can be customized, that is, the artificial nucleation sites or holes can be drilled therein with a laser or electron beam at the appropriate locations, and of the desired size. The location of the holes is preferably in alignment with the above located holes on the chips so that the nucleate boiling vapor bubbles when rising along the surface of the chips 10 after leaving the heater 20 will be in line with the artificial nucleation sites on the chip. The heater 20 is energized during the start up phase of the cooling process to start the nucleate boiling on the chips and is then turned off during the actual cooling phase to avoid the additional heat, and since the bubbles therefrom are no longer required.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of starting nucleate boiling at a predetermined temperature at nucleation sites on the walls of a unit to be cooled comprising:
    drilling holes with a high energy beam to obtain an opening having a narrow top and opening up to a critical diameter then tapering off in diameter until a predetermined bottom or length is reached;
    locating said holes in preselected positions on the walls to be cooled, the dimensions of said holes being selected to provide nucleate boiling at the predetermined temperature;
    immersing the surface to be cooled in a dielectric liquid having a boiling point at the predetermined temperature;
    orienting the walls to be cooled vertically in said dielectric liquid so that the nucleate boiling bubbles formed at said drilled holes when the surface reaches the predetermined temperature will wash liquid from the above located nucleation sites so that boiling will start at said predetermined temperature and thereby avoid temperature overshoot of the walls being cooled.

2. A method according to claim 1, wherein the step of drilling holes in the walls of the unit with a high energy beam to obtain an opening having a narrow top and opening up to a critical diameter then tapering off in diameter or until a predetermined bottom or length is reached is accomplished with a laser beam.

3. A method according to claim 1, wherein the step of drilling holes in the walls of the unit with a high energy beam to obtain an opening having a narrow top and opening up to a critical diameter then tapering off in diameter until a predetermined bottom or length is reached is accomplished with an electron beam.

4. A method according to claim 1, wherein the step of drilling holes in the walls of the unit with a high energy beam produces holes having a length L and average diameter $D_A$ where the ratio of $2 < L/D_A < 4$ and the average diameter $3\mu < D_A < 15\mu$ so that vapors get trapped in the holes when the unit is immersed in the dielectric liquid and an advancing vapor front will enter the hold and displace at least some of the liquid therein.

5. A method according to claim 1, wherein said holes drilled by said high energy beams are located in a line at the bottom of the wall to be cooled, and other nucleation sites are located down stream from said holes located in the line at the bottom of the wall, so that vapor bubbles rising from said holes located in the line at the bottom of the wall will wash the dielectric liquid from the down stream nucleation sites.

6. A method according to claim 1, wherein said vertically oriented walls have a pre-heater means located below said walls which, when heated to an appropriate temperature, causes vapor bubbles in the liquid which wash liquid out of the above located nucleation sites thereby predisposing the walls to start nucleate boiling at the predetermined starting temperature.

7. A method according to claim 5, wherein said pre-heater means is a resistance wire which, when electrically energized, produces sufficient heat to cause nucleate boiling bubbles to form and to rise washing liquid from the above located nucleation sites so that nucleate boiling can start therein when the required temperature is reached.

8. A method according to claim 7, wherein said resistance wire has holes of a predetermined size and location drilled therein by a high energy beam so as to obtain nucleate boiling therefrom at a predetermined temperature.

9. Apparatus for starting nucleate boiling at nucleate sites at a predetermined temperature comprising:
  at least one electronic chip having nucleate boiling sites located on at least a back surface thereof and mounted so that the back surface is exposed and is oriented vertically,
  a dielectric liquid covering at least the back surface of said electronic chip;
  a pre-heater having nucleation sites therein located below said electronic chip for generating nucleate vapor bubbles which rise in said liquid and wash the liquid from the above located nucleate sites in said chip.

10. Apparatus according to claim 9, wherein said pre-heater includes a predetermined number and location of artificial nucleation holes having a narrow top and opening up to a critical diameter than tapering off in diameter until a predetermined bottom or length is reached which start nucleate boiling at a predetermined temperature so as to wash the liquid from above located sites so that nucleate boiling at the chip sites can start when the predetermined chip temperature is reached.

* * * * *